(12) United States Patent
Shifrin

(10) Patent No.: US 7,948,315 B2
(45) Date of Patent: May 24, 2011

(54) LOW NOISE BINARY-CODED GAIN AMPLIFIER AND METHOD FOR TIME-GAIN COMPENSATION IN MEDICAL ULTRASOUND IMAGING

(75) Inventor: Lazar A. Shifrin, San Jose, CA (US)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 12/618,450

(22) Filed: Nov. 13, 2009

(65) Prior Publication Data

US 2010/0123520 A1 May 20, 2010

Related U.S. Application Data

(60) Provisional application No. 61/199,725, filed on Nov. 19, 2008.

(51) Int. Cl.
*H03F 3/45* (2006.01)

(52) U.S. Cl. .................................... 330/254

(58) Field of Classification Search .............. 330/254, 330/284, 295
See application file for complete search history.

(56) References Cited

U.S. PATENT DOCUMENTS

| | | | |
|---|---|---|---|
| H965 H | 9/1991 | Davis et al. | |
| 5,077,541 A | 12/1991 | Gilbert | |
| 5,684,431 A | 11/1997 | Gilbert et al. | |
| 5,903,191 A * | 5/1999 | Gosser | 330/254 |
| 6,229,375 B1 | 5/2001 | Koen | |
| 6,614,299 B2 * | 9/2003 | Hirvilampi et al. | 330/124 R |
| 7,151,409 B2 | 12/2006 | Koen et al. | |
| 7,425,866 B2 | 9/2008 | Kocaman et al. | |

* cited by examiner

*Primary Examiner* — Steven J Mottola
(74) *Attorney, Agent, or Firm* — DLA Piper LLP (US)

(57) ABSTRACT

A low noise variable gain amplifier and method for processing received signals in an ultrasound medical imaging system is disclosed. Unlike solutions known from the prior art, the signals are amplified by a binary-coded gain amplifier having its amplification factor progressively increased during the penetration of the transmitted pulse into a patient's body. This allows enhancing both the system dynamic range and Signal to Noise Ratio.

8 Claims, 6 Drawing Sheets

LOW NOISE BINARY-CODED GAIN AMPLIFIER AND METHOD FOR TIME-GAIN COMPENSATION IN MEDICAL ULTRASOUND IMAGING

RELATED APPLICATIONS

This patent application claims the benefit of U.S. Provisional Patent Application having a Ser. No. 61/199,725, filed Nov. 19, 2008 in the name of Lazar A. Shifrin, and entitled "Medical Ultrasound System Having Digital Method and Circuitry for Front-End Gain Control", whose disclosure is incorporated herein by reference in its entirety.

BACKGROUND OF THE INVENTION

1. Field of the Invention

This invention relates generally to low noise amplifiers having operatively digitally controllable gain. Specifically, the invention relates to digitally controllable variable-gain amplifiers and more particularly to such amplifiers used in ultrasound imaging.

2. Description of the Related Art

Variable-gain amplifiers (VGA) have been used for many years in a wide variety of applications including communication and ultrasound imaging.

In communication, a transmitter transmits a radio frequency modulated signal over a transmission channel to a receiver. When receiving, the signal level may vary due to various propagation phenomena. Similarly, medical ultrasound imaging systems are alternatively transmitting high-frequency ultrasonic pulses and processing the returned echoes. Propagating through a medium, the intensity of acoustic waves is attenuated with distance traveled. To compensate for the diminishing echo strength, most ultrasound scanners are aimed to elevate the receiver gain as echoes are received from deeper structures.

There are various known techniques for programming gain of an operational amplifier by switching the input and feedback resistors of various values. Unfortunately, use of these resistors induces an additional noise.

US Statutory Invention No. H965 entitled "Differential Amplifier with Digitally Controlled Gain" discloses a programmable gain differential amplifier having multiple sets of gain-setting resistors in the emitters of a differential transistor pair. The amplifier gain is controlled by selecting a resistor set or combination of resistor sets. Consequently, a programmable gain amplifier of this kind contributes more noise than the basic differential amplifier without emitter resistors.

A common method of gain control in prior art ultrasound front-end integrated circuits is based on progressively decreasing an initial signal attenuation, which is introduced at the start of transmission. By way of example, such a technique is disclosed in U.S. Pat. Nos. 5,077,541, 5,684,431, and 6,229,375. FIG. 1 depicts a typical block-diagram of a variable gain amplifier (VGA) operative to control the echo signal attenuation. This VGA comprises an attenuation means 102 arranged as a multi-section R-2R ladder network, a plurality of transconductance cells 104, a gain interpolator 106, a control port 108, an input port 110, and a post-amplifier 112.

In operation, a received echo signal applied to the port 110 feeds the ladder network 102. The ladder nodes in the network 102 provide respective output points which deliver progressively lower output signals. The effective "tap" point of this attenuator is continuously interpolated between and along the ladder by the interpolator 106 in response to an analog control signal applied to the control port 108. After that, the post-amplifier 112 brings the signal up to a level sufficient to properly drive an analog-to-digital converter. As explained below, a problem with the VGA of FIG. 1 is the signal-to-noise ratio (SNR) degradation in Doppler modalities.

In ultrasound color flow imaging, Doppler signals are combined with the echoes returned from stationary or slowly moving tissue commonly referred as clutter. The clutter signal tends to have a significantly higher strength as compared to the weak signals from blood cells. A typical range of the clutter-to-signal ratio is 40-100 dB.

Since large stationary signals are superimposed by Doppler components, the signal attenuation produced by the ladder network 102 would affect the flow signals as well. For instance, if an area of interest is located in close proximity to the patient's skin, the ladder network 102 is set to the maximum attenuation of typically 30 dB. Consequently, the blood flow components, which are inherently small, would be weakened further so that the signal may be buried in the combined noise produced by the ladder network 102 and post-amplifier 112.

U.S. Pat. No. 7,425,866 entitled "Digitally Adjusted Variable Gain Amplifier (VGA) Using Switchable Differential Pairs" discloses a VGA that includes a plurality of cascaded stage, each stage having a set of switchable differential pairs. Said VGA circuitry uses an interleaved thermometer coding method to adjust the gain. While the thermometer coding provides monotonic gain adjustment and almost uniform step size, it requires k+1 control signal lines operative to enable or disable at least k+1 differential pairs per stage; k is the maximum gain of a stage.

A modern ultrasound scanner may have up to 512 identical receive channels, each requiring a VGA. Functionally, the above described VGA is suitable for implementation in ultrasound. However, since the circuitry is noticeably complex, it would result in high manufacturing cost and substantial power consumption.

U.S. Pat. No. 7,151,409 entitled "Programmable Low Noise Amplifier and Method" discloses a programmable gain amplifier using a minimum number of gain control lines. FIG. 2 illustrates one embodiment of the invention comprising a tail current generator 202, a switch selector 204, a differential input port 206, a differential output port 208, a plurality of transistor pairs, a plurality of switch transistors for selective coupling the sources of said transistor pairs to said tail current generator, 202, and two load resistors $R_L$. The programmable gain amplifier of FIG. 2 operates as follows:

There are four transistor pairs Q5/6, Q7/8, Q9/10, and Q11/12 sharing a current I0 provided by a tail current generator 202. Switch transistors Q1, Q2, Q3, and Q4 are operative to connect the tail current generator 202 to a selected transistor pair or any combination of these pairs; said transistor pairs Q5/6, Q7/8, Q9/10, and Q11/12 have different transconductance values, which progressively increase in that order.

As is well known, the voltage gain of a transistor pair is proportional to its transconductance $g_m$. Thus, if the switch selector 204 would turn on only one of N switch transistors at a time, one of the N values of gain $G=g_m \cdot R_L$ can be obtained. Consequently, this scheme of gain setting is rather coarse.

Recognizing the need for fine gain resolution, the above-referred patent teaches "to simultaneously turn on more than one of the switch transistors to achieve the desired gain". However, the subsequent analysis shows that the proposed technique comes to only adding few predetermined gain values.

For small input signals, the transconductance of a differentially driven, source-coupled MOS transistor pair is given by:

$$g_m = \sqrt{2 \cdot \beta \cdot I_{SS}} \quad (1)$$

where $\beta = kW/L$ is the transconductance parameter, k is the intrinsic or process parameter, W and L are channel width and length, respectively, and $I_{SS}$ is the differential pair's bias current.

Operating in small signals conditions, the drain currents of the pair transistors fluctuate around $I_{SS}/2$. On the other hand, the drain current, $I_D$, is defined as:

$$I_D = \frac{\beta}{2}(V_{GS} - V_T)^2 \quad (2)$$

where $V_{GS}$ is the gate-source voltage, $V_T$ is the threshold voltage. Given $I_D = I_{SS}/2$, the required gate-source voltage yields:

$$V_{GS} = V_T + \sqrt{\frac{I_{SS}}{\beta}} \quad (3)$$

Assume that two transistor pairs, for instance Q5/6 and Q7/8, are simultaneously enabled. This results in splitting the bias current I0 so that most of the bias current I0 flows into the sources of the pair having lower input resistance. That is, if I1 and I1 are the bias currents of respective pairs of transistors $Q_n/Q_{n+1}$, their sum is equal to bias current I0 or I2=I0−I1.

Let AR1=W1/L1 and AR2=W2/L2 respectively denote the transistor aspect ratio of the pairs associated with said partial bias currents I1 and I2. Since the gate-source voltages $V_{GS}$ of Q5 and Q7 as well as Q6 and Q8 are equal, Equation 3 leads to:

$$I1/AR1 = I2/AR2 \quad (4)$$

Substituting I2=I0−I1 in Equation 4 yields:

$$I1 = I0 \frac{AR1}{AR1 + AR2} \quad (5)$$

$$I2 = I0 \frac{AR2}{AR1 + AR2} \quad (6)$$

The obtained formulas allow calculating small-signal transconductance of the two enabled differential pairs by combining Equations 1, 7, and 8. Simple manipulations give:

$$g_{m1} = \sqrt{2 \cdot k \cdot AR1 \cdot I1} = AR1 \cdot \sqrt{\frac{2 \cdot k \cdot I0}{AR1 + AR2}} \quad (7)$$

$$g_{m2} = \sqrt{2 \cdot k \cdot AR2 \cdot I2} = AR2 \cdot \sqrt{\frac{2 \cdot k \cdot I0}{AR1 + AR2}} \quad (8)$$

Referring to FIG. 2, all differential pairs are driven by the same input signal and have common load resistors. Thus, enabling two pairs, the resulting voltage gain, $G_{SUM}$, becomes:

$$G_{SUM} = R_L \cdot (g_{m1} + g_{m2}) = R_L \cdot \sqrt{2 \cdot k \cdot (AR1 + AR2) \cdot I0} \quad (9)$$

It is instructive to compare the value of $G_{sum}$ with the voltage gains $G_1$ and $G_2$ that are expected if only one of the two above mentioned pairs Q5/6 and Q7/8 is turned on. Following Equation 1, these gains are:

$$G_1 = R_L \cdot \sqrt{2 \cdot k \cdot AR1 \cdot I0} \quad (10)$$

$$G_2 = R_L \cdot \sqrt{2 \cdot k \cdot AR2 \cdot I0} \quad (11)$$

Assume further that AR2>AR1, i.e., $G_2 > G_1$ and only the pair with lager aspect ratio is turned on. In such a case, the obtained relative increase in gain, Δ, is given by:

$$\Delta = \frac{G_{SUM}}{G_2} - 1 = \sqrt{1 + \frac{AR1}{AR2}} - 1 \quad (12)$$

Since AR2>AR1, the above result can be represented by a Maclaurin series, which yields:

$$\Delta \approx \frac{AR1}{2 \cdot AR2} \quad (13)$$

To illustrate the degree of gain variation caused by turning on more than one differential pair, we will use the exemplary values of the W/L ratios and gains, which are listed in the above-referred patent. For example, the W/L ratios of the Q5/6 and Q7/8 pairs are 180/0.5 and 800/0.5, respectively. Consequently, enabling the Q5/6 pair in addition to the Q7/8 provides an 11% increase as compared with the inherent Q7/8 gain of 5.

In order to characterize the obtained results, one needs to take in to account that the next gain transition (i.e., solely enabling of the Q9/10 pair) results in gain of 10. In other words, the initial gain step of 10−5=5 has been reduced to 4.5. Thus, while enabling more than one of transistor pairs in a time increases the amount of available gain values, the obtained enchantment is relatively small and takes place at limited points of the entire gain range. Therefore, there is still a need in a low noise, programmable gain amplifier providing high gain resolution and adapted to new sub-micron technologies.

SUMMARY OF THE INVENTION

In the present invention, a digitally controllable variable gain amplifier circuit comprises a differential voltage-mode input terminal for receiving a differential pair of input signals and a plurality of switchable voltage-to-current (V-to-I) converters. These converters receive said pair of input signals in parallel. Each of the V-to-I converter also receives a control signal turning the converter ON and OFF, and provides a differential pair of output current signals. A differential transimpedance amplifier receives the plurality of output signals from the plurality of switchable V-to-I converters and provides a differential pair of voltage signals in response thereto. A look-up-table (LUT) stores a plurality of signals which are supplied to the plurality of switchable V-to-I converters as control signals therefor.

The present invention also relates to a method of compensating the attenuation of echo signals produced in an ultrasound imaging system from different depths by progressively increasing the gain of a receive channel during reception. The echoes returned from the tissue are applied to a digitally programmable transconductor comprising a plurality of N V-to-I converters adapted to be turned ON and OFF. When ON, the transconductance of a converter is binary weighted with respect to the transconductances of other ones of the plurality V-to-I converters. The current outputs of the plurality of said V-to-I converters are summed and supplied to a transconductance amplifier which converts the current into a voltage signal. The state (ON/OFF) of each V-to-I converter is controlled by a logical signal supplied from a look-up-table.

DETAILED DESCRIPTION OF PREFERRED EMBODIMENT

The following sections will discuss an improved low noise VGA, which gain is directly controlled by an external N-bit-wide word allowing to obtain $2^N-1$ gain levels within a given gain range. A description of the present invention is given with reference to FIGS. 3-6.

Figure 1:
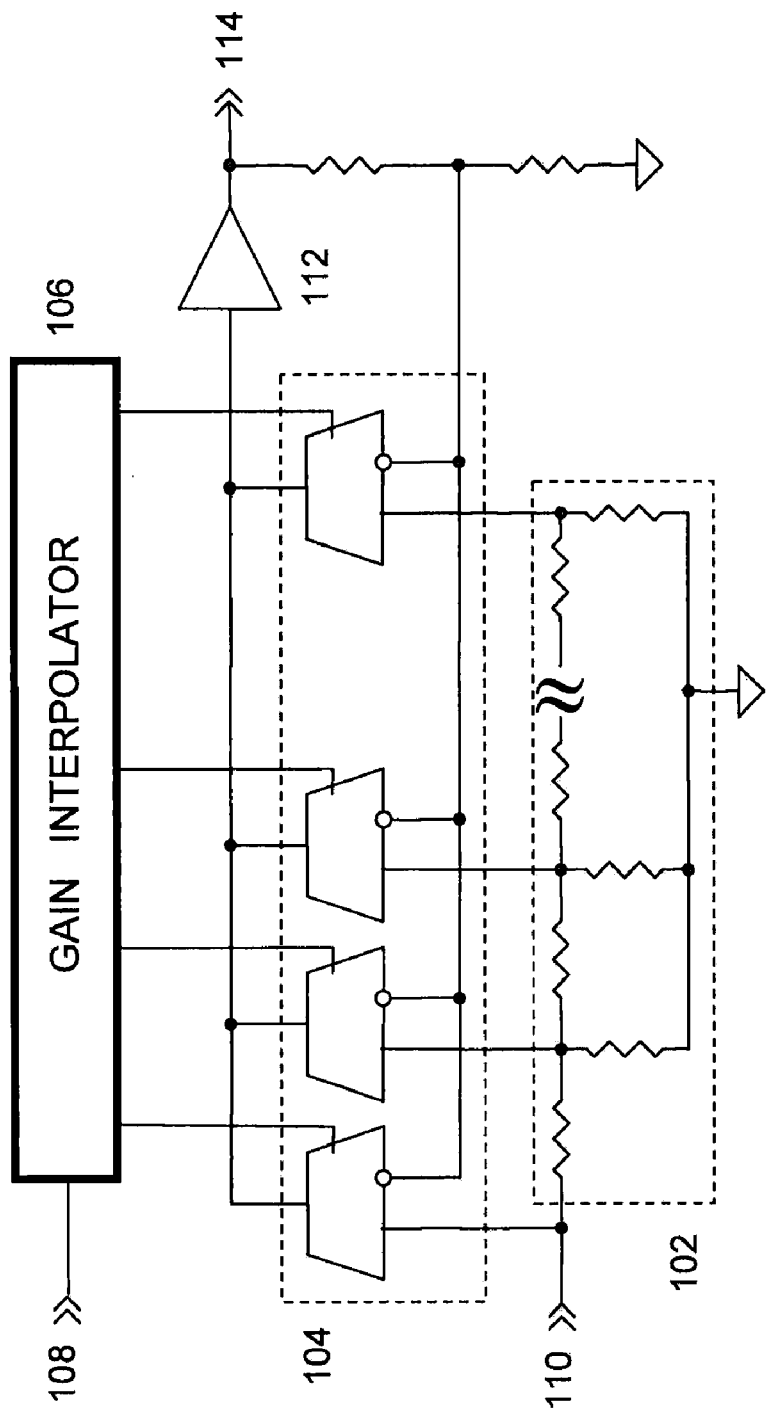
FIG. 1 shows a schematic diagram of a variable gain amplifier as known in the prior art.
Figure 2:
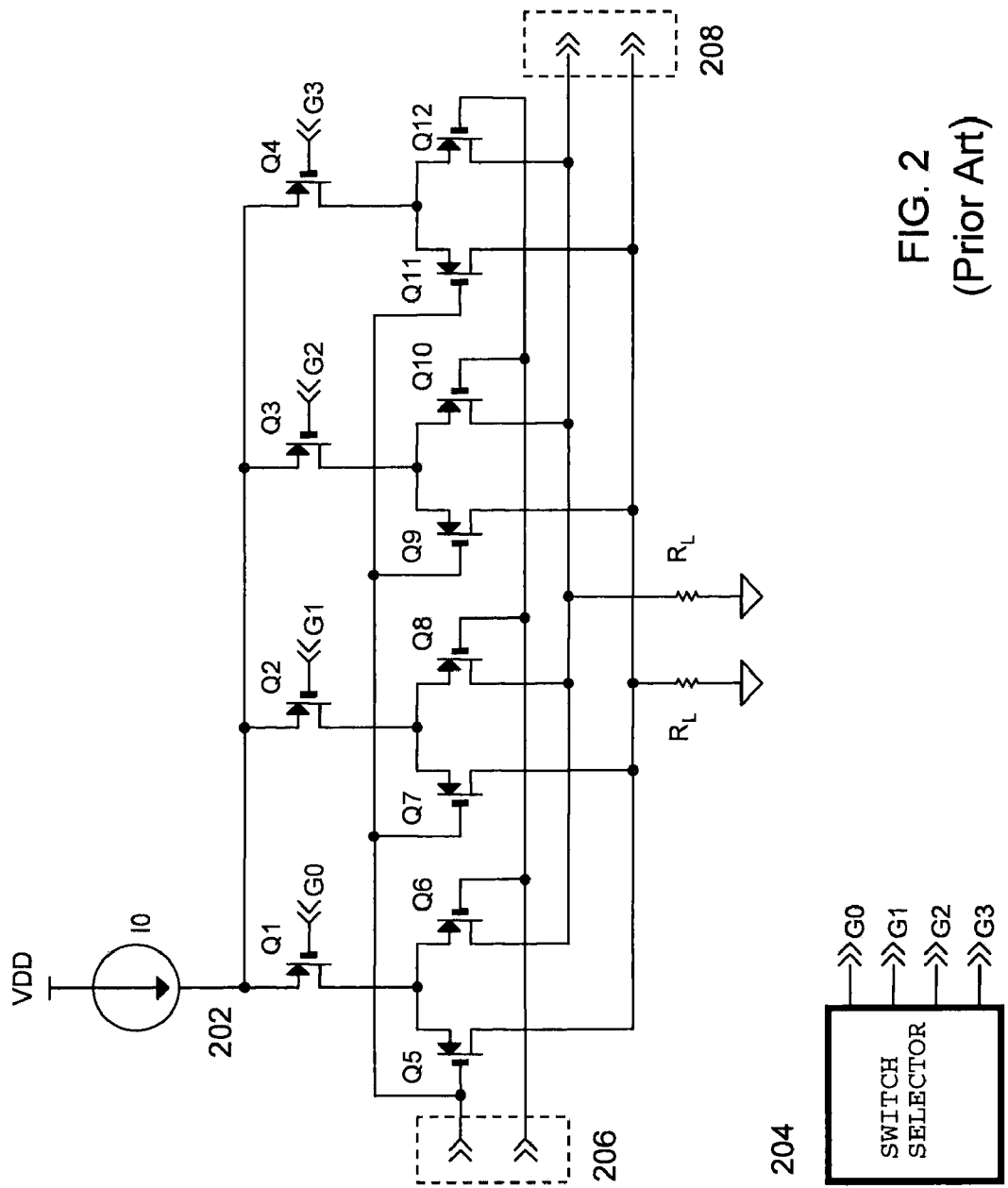
FIG. 2 depicts a block diagram of a low noise digitally-programmable gain amplifier as known in the prior art.
Figure 3:
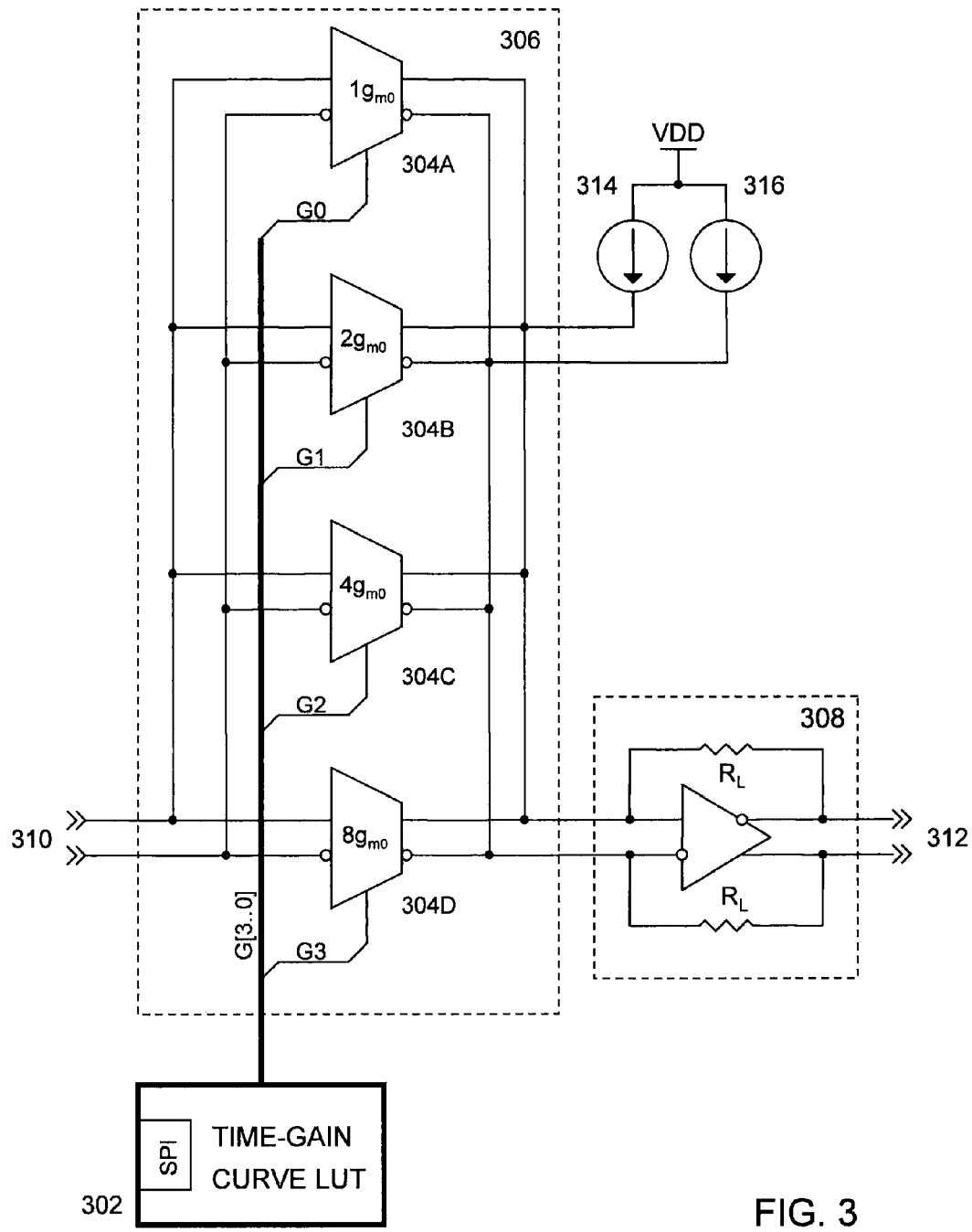
FIG. 3 is a block diagram of a preferred embodiment of a binary-coded gain amplifier of the present invention.

FIG. 3 is a functional block diagram showing the relationship between the elements of the VGA of the present invention. Referring to the diagram, the VGA comprises a differential input port 310 for receiving signals generated e.g. by a transducer, such as a piezoelectric transducer of an ultrasound medical imaging device, two identical current sources 314 and 316, a differential programmable transconductor 306 loaded by said current sources and connected to a differential transimpedance amplifier (that is, a current-to-voltage converter) 308 having a differential output port 312, and a look-up-table (LUT) 302 for storing a set of time-gain curves.

As it will be shown later in detail, the programmable transconductor 306 of FIG. 3 comprises a plurality N of cells 304 each arranged as a differential voltage-to-current (V-to-I) converter. As an example, FIG. 3 represents the circuit configuration for N=4. Accordingly, the four V-to-I converters (transconductor cells) are denoted as 304A-304D. However, the number of transconductors can be varied depending on the required dynamic range and resolution of gain control. Four transconductance cells are shown in FIG. 3 for simplicity and clarity, but the present invention is generalized to "N" cells.

Referring to FIG. 3 again, each of the four V-to-I converters 304 (A-D) accepts a differential voltage input from the input port 310, and provides a differential current output. There is also a 4-bit-wide control bus G[3 . . . 0] connected to the output of the LUT 302 allowing selective switching "on" and "of" each of said converters 304 (A-D). 4-bit-wide control sequences are stored in said LUT 302. The differential inputs of the cells 304 are respectively connected together and fed via an input port 310. The differential outputs of the cells are coupled in pairs to the inputs of said transimpedance amplifier 308.

Figure 4:
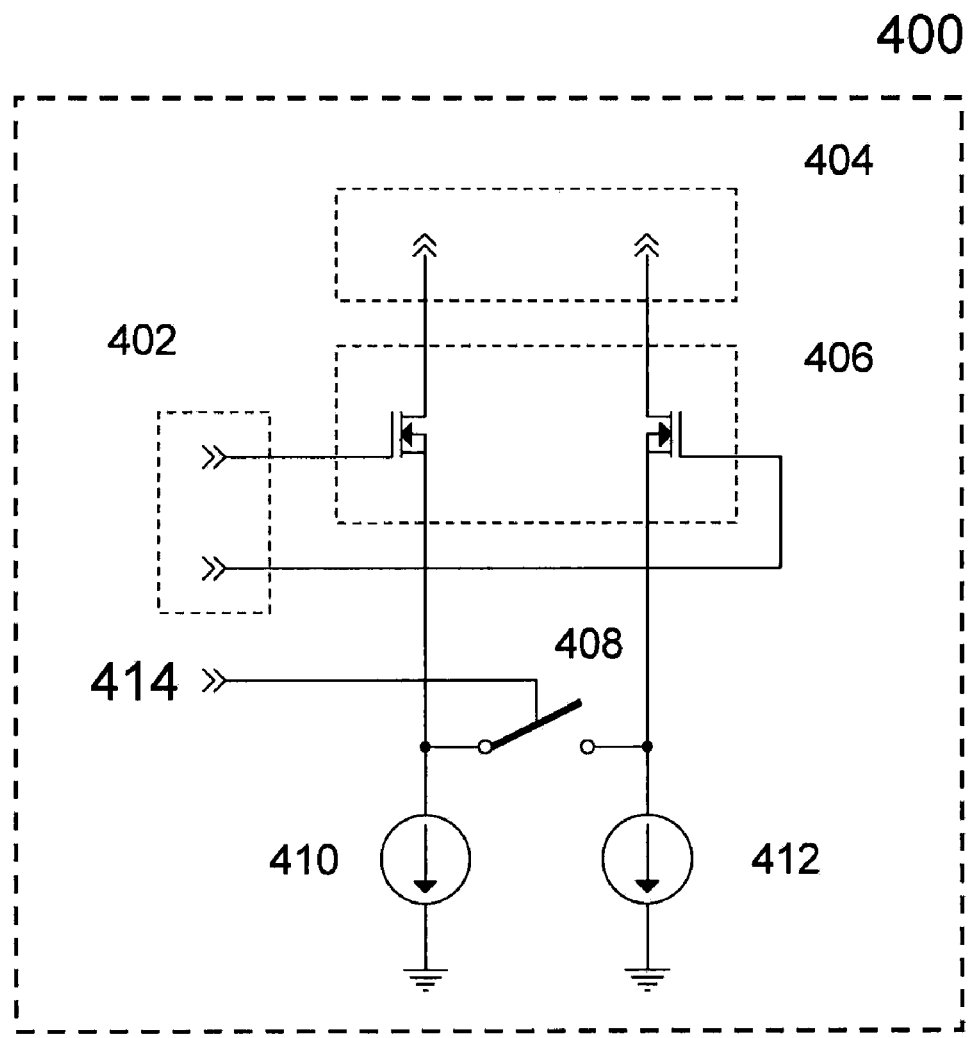
FIG. 4 is a schematic diagram of a transconductance cell, used in the binary coded gain amplifier of the present invention.

FIG. 4 depicts a circuit diagram of the transconductance cell 304 shown in FIG. 3. The cell 400 comprises a differential pair of MOS transistors 406, two identical current sources 410 and 412, an electronic switch 408 arranged to be turned "on" and "off" in response to an external logical signal applied to a control port 414, said switch 408 inserted between the source nodes of the transistor pair 406, and two terminals: a differential input 402 and a differential output 404. The control port 414 is connected to the LUT 302 shown in FIG. 3; the differential input port 402 is connected to the input port 310 shown in FIG. 3; and the differential output port 404 is connected to the transimpedance amplifier 308 shown in FIG. 3. The circuit of FIG. 4 operates as follows:

Being in "on" position, the switch 408 connects the source nodes of the transistor pair 406. As such, the pair operates as a conventional MOS differential amplifier having a transconductance of $g_m$.

Turning the switch 408 "off", the interaction between the transistors establishing the pair 406 is practically terminated. Thus, assuming that the current sources 410 and 412 are "ideal", the switched-off cell 400 would not provide the AC current components at its output.

According to the invention, the cells' transconductance, $g_n$, is binary weighted so that $$g_n = g_{m0} \cdot 2^n \quad (14)$$

where $g_{m0}$ is the transconductance of the lowest $g_m$ cell (i.e., 304A), $0 \leq n \leq N-1$, N is an integer.

Therefore, the cells 304B, 304C, and 304D manifest transconductance of $2g_{m0}$, $4g_{m0}$, and $8g_{m0}$, respectively.

Referring to FIG. 3, the transimpedance of the amplifier 308 is $R_L$. Thus, the resulting voltage gain of an input signal passing through a turned-on cell that has the number "n" is:

$$G_n = g_{m0} \cdot R_L \cdot 2^n \quad (15)$$

From Equation 15, the gain of the proposed programmable VGA can be expressed as:

$$G = g_{m0} \cdot R_L \sum_n 2^n \cdot \gamma_n \quad (16)$$

where $\gamma_n$ is equal to unity if a cell is turned "on" and zero otherwise.

When all cells 304 are turned on, $\gamma_n = 1$ for $0 \leq n \leq N-1$. Consequently, the amplifier's gain approaches its maximum, $G_{MAX}$. Under these conditions, Equation 16 yields:

$$G_{MAX} = g_{m0} R_L (2^N - 1) \quad (17)$$

Referring to Equation 17, gain resolution of the proposed VGA is given by:

$$\Delta G = g_{m0} \cdot R_L \quad (18)$$

As can be seen from Equation 1, given the intrinsic parameter k, there are two ways to varying the transconductance of a differential pair, namely, by appropriate selecting the bias current $I_0$ or the transistor aspect ratio W/L.

Switching a plurality of cells having a common load but consuming different bias currents would produce erroneous output signals. At the same time, varying the transistor geometry while keeping a constant bias current would result in smooth transitions.

Figure 5A:
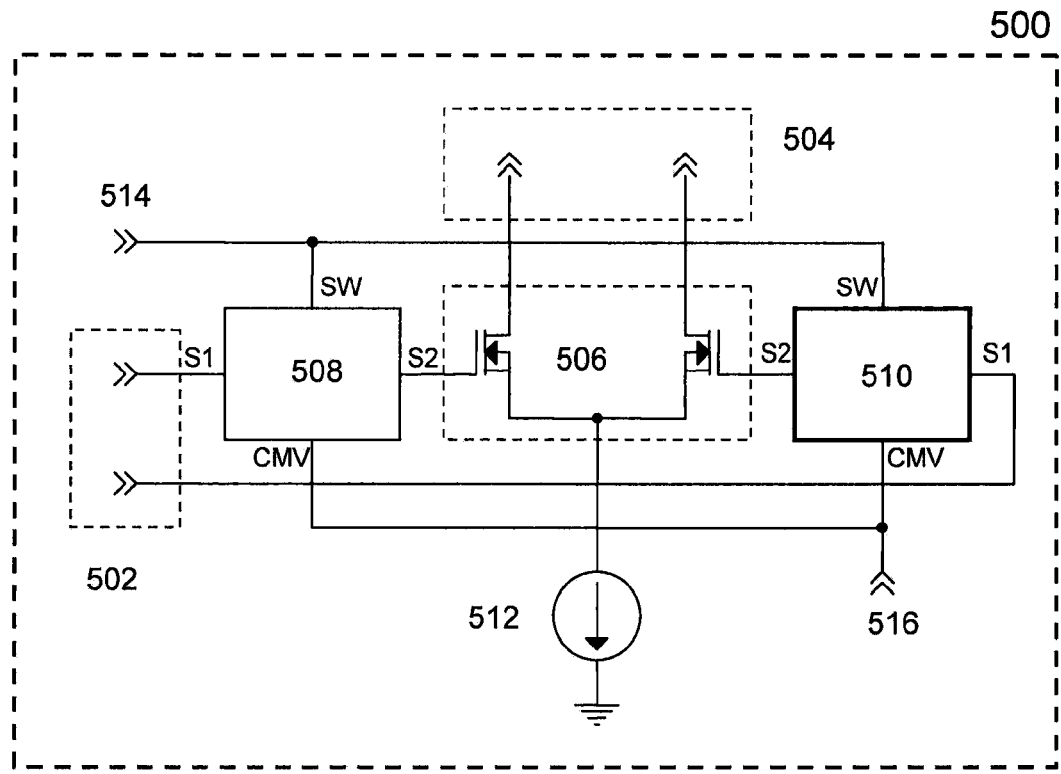
FIG. 5A is a schematic diagram of another embodiment of a transconductance cell.
Figure 5B:
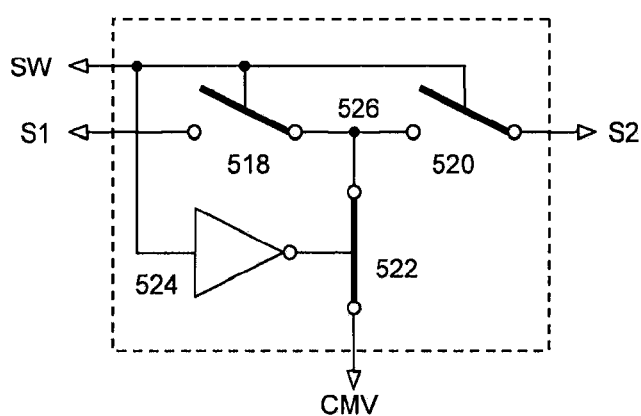
FIG. 5B is a schematic diagram of the switches 508 and 510 of FIG. 5A

FIG. 5A depicts a circuit diagram of another embodiment of the transconductance cells 304 shown in FIG. 3. A transconductor 500 comprises a differential pair of MOS transistors 506, a current source 512, two T-switches 508 and 510 arranged to be turned "on" and "off" in response to an external logical signal applied to a control terminal 514, two differential signal terminals: an input 502 and an output 504, and a common-mode voltage terminal 516. The control terminal 514 is connected to the LUT 302 shown in FIG. 3; the differential input port 502 is connected to the input port 310 shown in FIG. 3; and the differential output port 504 is connected to the transimpedance amplifier 308 shown in FIG. 3. The circuit of FIG. 5A operates as follows:

As shown in FIG. 5B, the switches 508 and 510 are constructed using a T configuration to obtain high "OFF" isolation while maintaining good frequency response in the "ON" condition. While the T-switch is in the OFF state, two series switches 518 and 520 are open and a shunt switch 522 is closed because of the inverter 524. Thus, a common node of said series switches 526 becomes connected to a node CMV, which is AC-grounded at the terminal 516. This eliminates a parasitic signal path through the "off" capacitances of the switches 518 and 520.

When the T-switch is in the ON condition, the shunt switch 522 is open and the input signals provided by the port 502 are passed from a node S1 to a node S2 because the two series switches 518 and 522 are now closed.

As can be seen in FIG. 5A, the nodes S2 are respectively coupled to the gates of the transistor pair 506. Consequently, setting the switches 518 and 520 in the ON state, the pair 506 will operate as a conventional MOS differential amplifier having a transconductance of $g_m$. As such, the cell's transconductance and voltage gain can be expressed by Equations 14 and 15. Likewise, using the transconductor cells 500, gain properties of the proposed VGA are given by Equations 16-18.

In practice, there are transient effects when any of the above switches is turned on or off. For instance, short duration spikes are generated as a result of capacitive coupling between digital and analog signals. These spikes may create a false acquisition time interval during which the output level is invalid. The effect of charge injection is of concern when a switch drives a high-impedance load like a MOSFET gate, since the injected charge, $Q_{INJ}$, will change the gate voltage of the transconductor cell's transistors. Fortunately, a differential signaling scheme reduces the charge injection error substantially. However, basic switching circuits are still dependable on the amount of $Q_{INJ}$.

It is well known that emitter-coupled logic (originally called current steering logic) transistor demonstrates considerable speed advantages because it never operates in the saturation region. From this prospective, it is believed that using current mode logic transistor to control a transconductance cell would provide high speed while avoiding charge injection errors.

Figure 6:
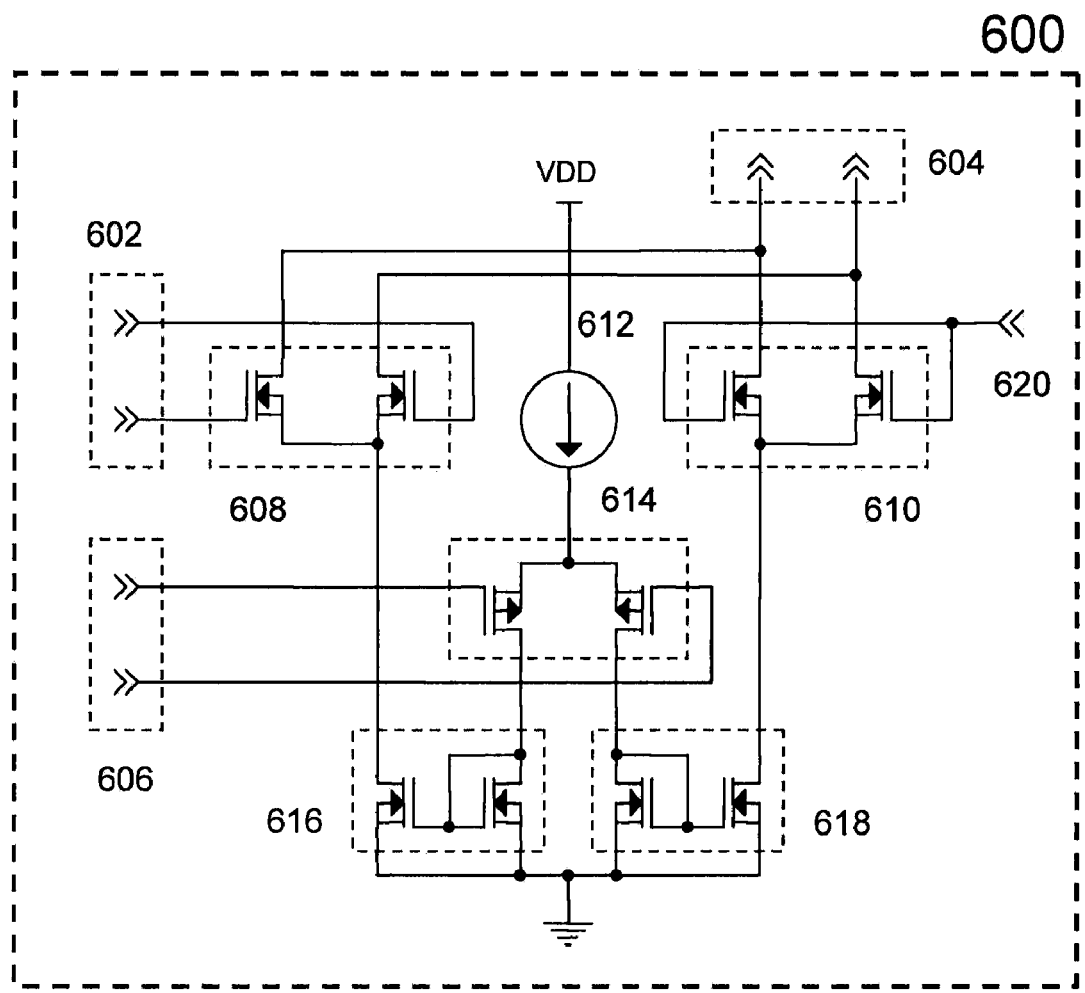
FIG. 6 is a schematic diagram of a preferred embodiment of a transconductance cell, used in the binary coded gain amplifier of the present invention.

FIG. 6 depicts a circuit diagram of a preferred embodiment of the transconductance cells 304 shown in FIG. 3 A transconductor cell 600 comprises three differential signal terminals: an input 602, an output 604, and a control 606, two identical differential source-coupled pairs of NMOS transistors, 608 and 610, two identical current mirrors 616 and 618 both having the current mirror ratio of one, a differential source-coupled pair of PMOS transistors, 614, having their sources connected to a current source 612, and a common-mode voltage terminal 620. The circuit of FIG. 6 operates as follows:

Since the gates of said transistor pair 614 are connected to the terminal 606, a differential control signal steers a bias current provided by said current source 612 to one transistor of the pair 614. Accordingly, only one of the two current mirrors 616 and 618 will respectively direct the bias current to one or another of the differential pairs 608 and 610. As a result, switching the PMOS pair 614 will activate only one of said two NMOS differential amplifiers, i.e., 608 or 610.

As shown in FIG. 6, the drain nodes of the transistor pairs 608 and 610 are respectively connected to the output terminal 604. When the pair 608 is turned-on by directing the bias current via the current mirror 616, the circuit operates as a basic differential transconductor.

Regarding the transistor pair 610, it has both gates connected to the terminal 620 and therefore there is no AC signal applied. Consequently, turning ON the cell 610 would not provide any AC current flow through the output terminal 604. At the same time, switching the pairs 608 and 610 does not affect the DC operational point at the cell output.

Thus, the important advantages of the invention can be summarized as follows:
1. The amplifier's gain is directly controlled by an external N-bit-wide word that allows to obtain 2N−1 gain levels within a given gain range without interpolation.
2. The circuitry progressively increases the gain during the transmit pulse penetration that results in keeping the output signal at substantially maximal level avoiding nonlinearity.
3. Mostly operating with currents rather than voltages, the proposed architecture is particularly suitable for low-voltage process technologies that support broadband applications.

As previously discussed, one of the uses for the VGA of the present invention is in an ultrasonic medical imaging system. This systems use a pulse-echo method alternately functioning in two basic modes: transmit and receive. In the transmit mode, one or more transducer elements, are excited by electrical pulses emitted by a transmitter to generate acoustic energy signals which are directed at an object or patient. During propagation, acoustic waves are echoed back from the various tissue structures of the object or patient towards the transducer. Then, in the receive mode, echoes are received and converted by the same transducer element into electrical signals, these signals are directed to a receiver.

When the ultrasonic waves propagate through an object (usually a person or patient) they are exponentially attenuated with respect to distance traveled. However, with the VGA of the present invention one can compensate the attenuation by progressively increasing the signal gain with depth. Thus, the intensity of a signal propagating through a medium would remain approximately constant. In contrast, as discussed hereinabove, the prior art teaches progressively decreasing an initial signal attenuation which is introduced at the start of the transmission of the ultrasonic pulse. In such a case, the intensity of the weak echoes inseparable from a clutter is diminished even more and, consequently, these echoes can fall below the noise floor. Therefore, with the VGA of the present invention, a higher resolution of an ultrasonic image is possible.

While the invention has been described above by reference to various embodiments, it would be understood that many changes and modifications could be made without departing from the scope of the invention. For example, different current mirrors, sources of the bias current, or the fashion of their controlling may be used. It is therefore intended that the foregoing detailed description be understood as an illustration of the presently preferred embodiment of the invention, and not as a definition of the invention. It is only the following claims or added claims, including all equivalents, are intended to define the scope of this invention.

I claim:

1. A digitally controllable variable gain amplifier (VGA) comprising:
   a differential voltage-mode input terminal for receiving a differential pair of input signals;
   a differential N-bit programmable transconductor for receiving said differential pair of input signals and for receiving a N-bit-wide control signal to control the transconductance of said programmable transconductor;
   a differential transimpedance amplifier for receiving a differential output signal from said transconductor and for providing a differential output signal in response thereto; and
   a look-up-table (LUT) for storing a plurality of control signals and for supplying said plurality of control signals to said transconductor, wherein said control signals increase the gain of said amplifier during the receipt of said input signals.

2. The VGA of claim 1, wherein said programmable transconductor comprises:
   an N-bit-wide control bus and a plurality N of differential voltage-to-current (V-to-I) converters, each for receiving said differential pair of input signals, and for receiving a single-bit control signal for switching the converter ON and OFF, and for providing a differential pair of current outputs.

3. The VGA of claim 2, further comprising a pair of identical current sources for loading said voltage-to-current converters.

4. The programmable transconductor circuit of claim 2, wherein each of said V-to-I converters comprises a differential input port, a differential output port, and a control port operative for switching the V-to-I converter ON and OFF, wherein said differential input ports are coupled in pairs to the differential voltage-mode input terminal, said differential output ports are connected together in pairs and arranged to feed said differential transimpedance amplifier; and wherein said control ports are connected to said N-bit-wide control bus on a per-bit basis.

5. The programmable transconductor circuit of claim 2, wherein the transconductances of said voltage-to-current converters are binary weighted.

6. A digitally controllable variable gain amplifier (VGA) comprising:
   a differential voltage-mode input terminal for receiving a differential pair of input signals;
   a differential N-bit programmable transconductor for receiving said differential pair of input signals and for receiving a N-bit-wide control signal to control the transconductance of said programmable transconductor; said programmable transconductor comprising an N-bit-wide control bus and a plurality N of differential voltage-to-current (V-to-I) converters, each for receiving said differential pair of input signals, and for receiving a single-bit control signal for switching the converter ON and OFF, and for providing a differential pair of current outputs; wherein each of said V-to-I converters comprises first and second MOS transistors connected to establish a differential transistor pair, first and second constant current sources, and an electronic switch; and wherein:
   the first and second transistors having source, gate, and drain nodes, said current sources respectively coupled to the source nodes of said transistors, said switch between the source nodes of said first and second transistors and arranged to be turned on and off in response to the state of a signal inflowing through the control port, said gate nodes respectively coupled to said input port, said drain nodes respectively coupled to said output port;
   a differential transimpedance amplifier for receiving a differential output signal from said transconductor and for providing a differential output signal in response thereto; and
   a look-up-table (LUT) for storing a plurality of control signals and for supplying said plurality of control signals to said transconductor.

7. A digitally controllable variable gain amplifier (VGA) comprising:
   a differential voltage-mode input terminal for receiving a differential pair of input signals;
   a differential N-bit programmable transconductor for receiving said differential pair of input signals and for receiving a N-bit-wide control signal to control the transconductance of said programmable transconductor; said programmable transconductor comprising an N-bit-wide control bus and a plurality N of differential voltage-to-current (V-to-I) converters, each for receiving said differential pair of input signals, and for receiving a single-bit control signal for switching the converter ON and OFF, and for providing a differential pair of current outputs; The wherein each of said N differential V-to-I converters comprises two identical T-switches and a differential pair of MOS transistors each having drain, gate, and source nodes, the drain nodes respectively coupled to the output port, the source nodes coupled to a bias current source; and wherein:
   said T-switches providing signal paths between said differential input port and the gate nodes, said signal paths are turned on and off in response to the state of a signal inflowing through the said control port;
   a differential transimpedance amplifier for receiving a differential output signal from said transconductor and for providing a differential output signal in response thereto; and
   a look-up-table (LUT) for storing a plurality of control signals and for supplying said plurality of control signals to said transconductor.

8. A digitally controllable variable gain amplifier (VGA) comprising:
   a differential voltage-mode input terminal for receiving a differential pair of input signals;
   a differential N-bit programmable transconductor for receiving said differential pair of input signals and for receiving a N-bit-wide control signal to control the transconductance of said programmable transconductor; said programmable transconductor comprising an N-bit-wide control bus and a plurality N of differential voltage-to-current (V-to-I) converters, each for receiving said differential pair of input signals, and for receiving a single-bit control signal for switching the converter ON and OFF, and for providing a differential pair of current outputs; wherein each of said N differential V-to-I converters comprises a differential source-coupled pair of PMOS transistors, first and second differential source-coupled pairs of NMOS transistors, first and second NMOS current mirrors both providing the current mirror ratio of one and having an input and an output, and a common-mode voltage terminal; and wherein:
   each of said transistors has drain, gate, and source, the sources of the PMOS transistor pair connected to a bias current source, the drains of the PMOS transistor pair connected to the inputs of the first and second current mirrors while the respective mirrors' outputs coupled to the sources of the first and second NMOS transistor pairs, the drains of the first and second NMOS transistor pairs respectively coupled to the output port, the gates of the first NMOS transistor pair respectively coupled to said input port, the gates of the second NMOS transistor pair connected to the common-mode voltage terminal, the gates of the PMOS transistor pair represent a differential control port operative to turn the V-to-I converter on and off;

a differential transimpedance amplifier for receiving a differential output signal from said transconductor and for providing a differential output signal in response thereto; and a look-up-table (LUT) for storing a plurality of control signals and for supplying said plurality of control signals to said transconductor.

* * * * *